United States Patent [19]
Neilson et al.

[11] Patent Number: 6,054,369
[45] Date of Patent: Apr. 25, 2000

[54] LIFETIME CONTROL FOR SEMICONDUCTOR DEVICES

[75] Inventors: John Manning Savidge Neilson, Norristown; John Lawrence Benjamin, Mountaintop; Maxime Zafrani, Kingston, all of Pa.

[73] Assignee: Intersil Corporation, Palm Bay, Fla.

[21] Appl. No.: 08/885,878

[22] Filed: Jun. 30, 1997

[51] Int. Cl.$^7$ .................................................. H01L 21/30
[52] U.S. Cl. ................................................ 438/455; 438/458
[58] Field of Search .................................. 438/455, 456, 438/457, 458, 459

[56] References Cited

U.S. PATENT DOCUMENTS

| | | | |
|---|---|---|---|
| 4,684,413 | 8/1987 | Goodman et al. | |
| 4,774,196 | 9/1988 | Blanchard | 438/455 |
| 5,231,045 | 7/1993 | Miura et al. | 438/459 |
| 5,232,870 | 8/1993 | Ito et al. | 438/455 |
| 5,360,752 | 11/1994 | Brady et al. | 438/459 |
| 5,374,564 | 12/1994 | Bruel | 438/455 |
| 5,451,547 | 9/1995 | Himi et al. | 438/455 |
| 5,506,153 | 4/1996 | Brunner et al. | 438/459 |
| 5,541,122 | 7/1996 | Tu et al. | 438/455 |
| 5,661,316 | 8/1997 | Kish, Jr. et al. | 257/190 |
| 5,755,914 | 5/1998 | Yonehara | 438/455 |

*Primary Examiner*—Kevin M. Picardat
*Attorney, Agent, or Firm*—Rogers & Killeen

[57] ABSTRACT

A method of controlling minority carrier lifetime in a semiconductor device in which the density of recombination centers is controlled so that the recombination centers are concentrated in a thin buffer layer adjacent a blocking layer in one of two bonded wafers. The density is controlled by misaligning crystal axes of the two wafers or by doping the bonding surface of one of the wafers before the wafers are bonded. Both methods generate recombination centers in the thin buffer layer that forms around or adjacent the bonding interface. A semiconductor device made by this method includes a buffer layer with a significantly higher density of recombination centers than the adjacent blocking layer to thereby improve control of minority carrier lifetime.

26 Claims, 3 Drawing Sheets

LIFETIME CONTROL FOR SEMICONDUCTOR DEVICES

BACKGROUND OF THE INVENTION

The present invention is directed to improved minority carrier lifetime control in semiconductor devices, and more particularly to method and device in which a layer adjacent a blocking layer of a semiconductor device is provided with a significantly higher density of recombination centers.

As is known, the switching speed of semiconductor devices (such as during reverse recovery or turn-off) and the gain of parasitic bipolar transistors in field effect transistors are reduced by reducing the minority carrier lifetime. The minority carrier lifetime is the time to recombination of an electron in a P type semiconductor material or of a hole in an N type semiconductor material. Carrier lifetime is reduced by performing a lifetime control procedure to reduce minority carrier lifetime so that the carriers, the holes and electrons, remaining after conduction will recombine more rapidly. The present invention is directed to an improved lifetime control procedure and to devices fabricated with the procedure.

Carrier lifetime control procedures provide locations, known as recombination centers, in the semiconductor device where recombination of the carriers is facilitated. The recombination centers, whose density may be on the order of 0.1 to 1.5 ppma (parts per million atomic), are locations of crystallographic strain which may be caused by the generation of dislocations in the crystal structure of the silicon, such as by introduction of impurities. Various methods for generating recombination centers are known. For example, silicon may be doped with a heavy metal dopant, such as gold or platinum. The heavy metal dopant (the impurity) generates recombination centers because the heavy metals have energy levels within the forbidden energy band of silicon. A further method of generating recombination centers is to generate dislocations throughout the silicon by bombarding it with radiation, such as high energy electrons, neutrons or protons. The dangling bonds in these dislocations have mid-band energy levels which serve as recombination centers for the carriers. See, for example, U.S. Pat. No. 4,684,413, issued Aug. 4, 1986 to Goodman, et al.

It has been found that the recombination centers are preferably concentrated in a thin layer in the semiconductor device adjacent a blocking layer. With reference now to FIGS. 1a–d which show exemplary prior art semiconductor devices (a rectifier in FIG. 1a, a MOSFET in FIG. 1b, an IGBT in FIG. 1c and an MCT (MOS Controlled Thyristor) in FIG. 1d), a semiconductor device may include a substrate 12 with a layer 14 which is more lightly doped and performs various functions depending on the type of device in which it is found. Layer 14 is denoted herein as a blocking layer, although its functions may vary. Blocking layer 14 typically is atop a relatively more heavily doped layer 16, denoted herein as a buffer layer, which has been found to be the preferred location for a high density of recombination centers.

This preferred location for a high density of recombination centers in a thin layer adjacent blocking layer 14 produces low current leakage, low on-voltage for a given switching speed, and a robust avalanche breakdown. Leakage is lower because recombination centers also are generation centers and generate leakage currents if they are located in blocking layer 14 where they are subjected to the high electric fields which appear in blocking layer 14 when the device is supporting a high voltage. On-voltage is lower for a given speed because carriers in blocking layer 14 are rapidly removed by the electric field which builds as voltage on the device increases, but carriers outside blocking layer 14 are inaccessible to the electric field and must be removed by the slower process of recombination. As a result recombination centers in blocking layer 14 cause a higher on-voltage but are not as effective in improving switching speed as those outside blocking layer 14. Recombination centers in blocking layer 14 may also cause "fragile" breakdown characteristics because they trap some of the majority carriers and thereby increase the resistivity of the material forming blocking layer 14. When the resistivity of blocking layer 14 is too high, the high field region in avalanche breakdown may become unstable and cause a localized overheating and burnout (denoted a "fragile" breakdown). Reducing the number of recombination centers in blocking layer 14 reduces the likelihood of increasing the resistivity of blocking layer 14 and makes avalanche breakdown more robust, i.e., less "fragile".

One of the problems with the prior art, as is apparent from the distribution of recombination centers (x) in FIGS. 1a–d, is that the recombination centers are distributed generally uniformly throughout the silicon crystal, not in the preferred buffer layer adjacent blocking layer 14. Note that, in theory, proton radiation dislocations can be confined to a layer, but this has not been shown to be a practical solution because of the difficulty controlling the very high energy required, on the order of several megavolts.

By way of further background, wafer bonding may be used to fabricate silicon devices. In this process, the bonding surfaces of two silicon wafers are polished sufficiently flat so that when the polished surfaces are brought into contact with each other, enough of the neighboring silicon atoms can form covalent bonds across the wafer-to-wafer bonding interface to link the two wafers into a single crystal. The present invention takes advantage of this wafer bonding process to facilitate the formation of the preferred buffer layer which has a significantly higher density of recombination centers than the adjacent blocking layer.

Accordingly, it is an object of the present invention to provide a novel method and device in which recombination centers of a semiconductor device are concentrated in a buffer layer at or near a wafer-to-wafer bonding interface, thereby obviating the problems of the prior art.

It is another object of the present invention to provide a novel method and device in which the density of recombination centers in a buffer layer adjacent a blocking layer in a semiconductor device is significantly higher than that of the blocking layer.

It is yet another object of the present invention to provide a novel method and device in which a semiconductor device formed by bonding two wafers has a blocking layer and an adjacent buffer layer containing the wafer-to-wafer bonding interface in which the recombination centers are concentrated in the buffer layer and are substantially absent from the blocking layer.

It is still another object of the present invention to provide a novel method of controlling minority carrier lifetime in a semiconductor device by selectively misaligning features of the bonding surfaces of two wafers to control a density of recombination centers in a layer at or adjacent a wafer-to-wafer bonding interface between the two wafers, the two wafers being bonded so that the features of the bonding surfaces of the two wafers are misaligned to generate dislocations which form the recombination centers in the layer.

It is a further object of the present invention to provide a novel method of controlling minority carrier lifetime in a semiconductor device by selectively misaligning features of the bonding surfaces of two wafers in which the features are misaligned by either rotating the wafers or polishing the wafers at different angle.

It is yet a further object of the present invention to provide a novel method of controlling minority carrier lifetime in a semiconductor device by selectively doping at least one of the bonding surfaces of two wafers to control a density of recombination centers in a layer at or adjacent a wafer-to-wafer bonding interface between the two wafers, the dopant forming the recombination centers in the layer.

It is still a further object of the present invention to provide a novel method of controlling minority carrier lifetime in a semiconductor device by selectively doping at least one of the bonding surfaces in which the doping is performed after polishing the bonding surfaces by either evaporation or implantation.

It is still yet a further object of the present invention to provide a novel method of controlling minority carrier lifetime in a semiconductor device by selectively doping at least one of the bonding surfaces of two wafers to form recombination centers and by selectively misaligning features of the bonding surfaces of the two wafers to generate dislocations which serve as further recombination centers.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

With reference now to FIGS. 2a–d which illustrate examples of semiconductor devices incorporating embodiments of the present invention, a method of controlling minority carrier lifetime in a semiconductor device may include the step of controlling a density of recombination centers (x) at a wafer-to-wafer bonding interface 20 adjacent a blocking layer 22 of the semiconductor device so that the recombination centers are concentrated in a buffer layer 24 at or near bonding interface 20 and adjacent blocking layer 22. Desirably, the density of recombination centers (x) in the buffer layer 24 is in a range of from $10^{14}/cm^3$ to $10^{19}/cm^3$. Also, it is desirable the buffer layer 24 be from 1 micron to 50 microns in thickness. Preferably, the recombination centers (x) are substantially absent from the blocking layer 22 and, typically may be in a concentration of less than the concentration of the buffer layer in the blocking layer 22. The figures show bonding interface 20 inside buffer layer 24, although bonding interface 20 may be at an edge or even slightly spaced from buffer layer 24.

In the invention the bonding surface of at least one of two wafers which are to be bonded to form substrate 12 is processed before bonding so that dislocations will form at the wafer-to-wafer bonding interface when the wafers are bonded. The dislocations become recombination centers for the minority carriers. The bonding surface may be processed before bonding by either or both of the two methods discussed below. As used herein, the term dislocation refers to any strain location regardless of the cause of the strain (e.g., dopant or crystalline misalignment).

Figure 1A:
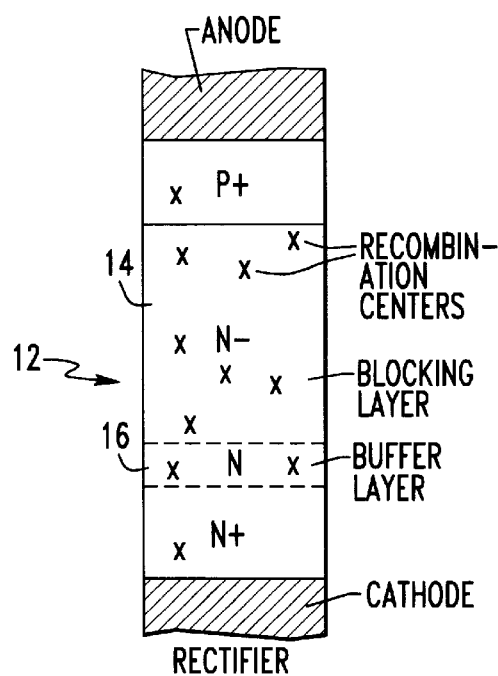
FIGS. 1a–d show vertical cross-sections of various semiconductor devices of the prior art illustrating the distribution of recombination centers throughout the silicon substrate.
Figure 1B:
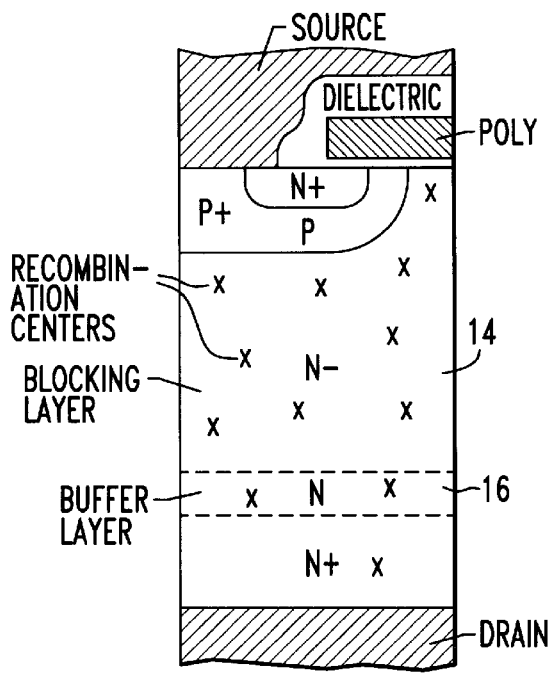
Figure 1C:
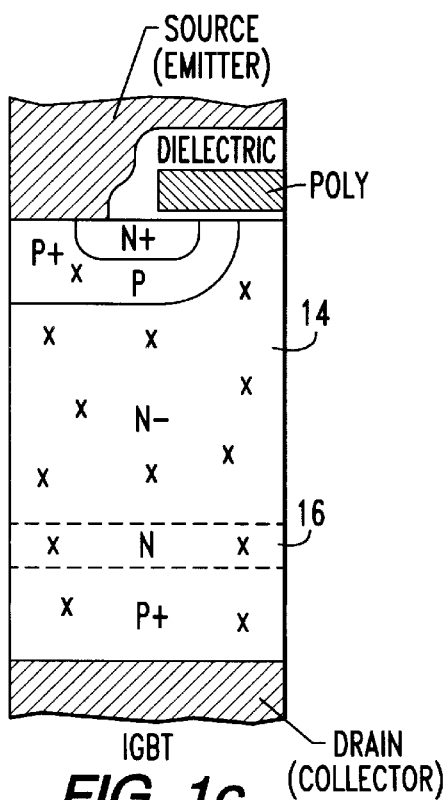
Figure 1D:
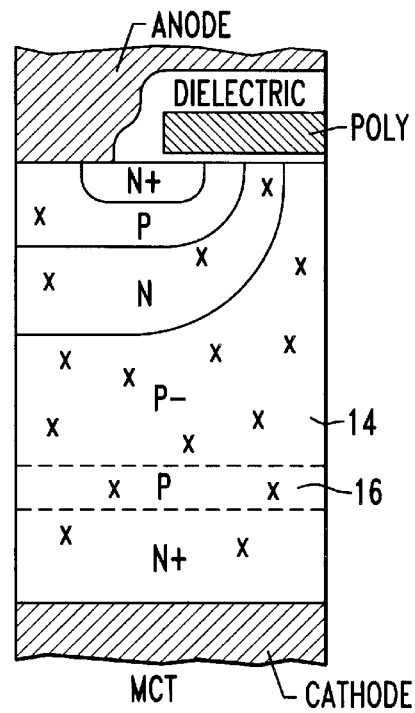
Figure 2A:
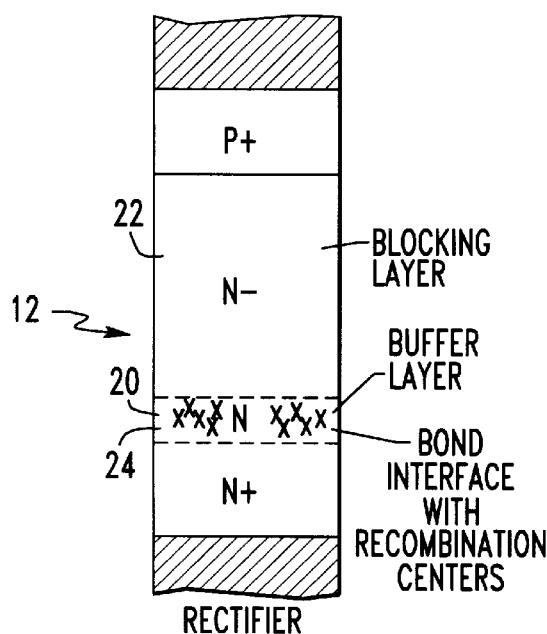
FIGS. 2a–d show vertical cross-sections of various semiconductor devices illustrating the layer of recombination centers in embodiments of the present invention.
Figure 2B:
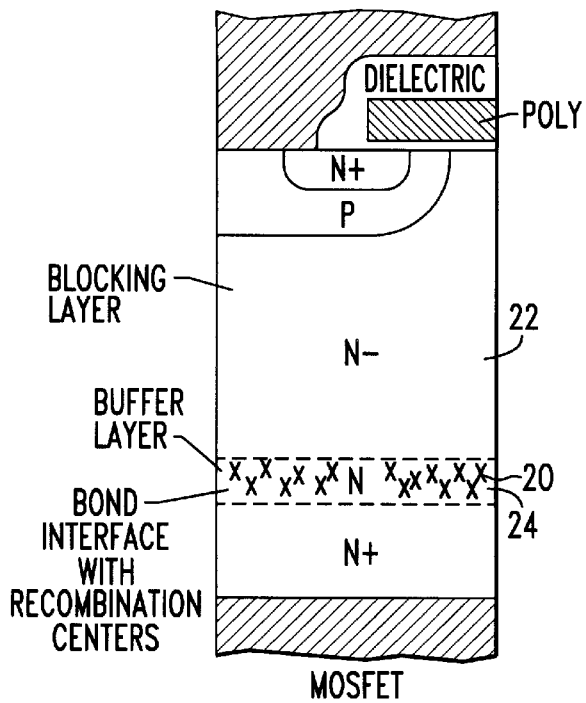
Figure 2C:
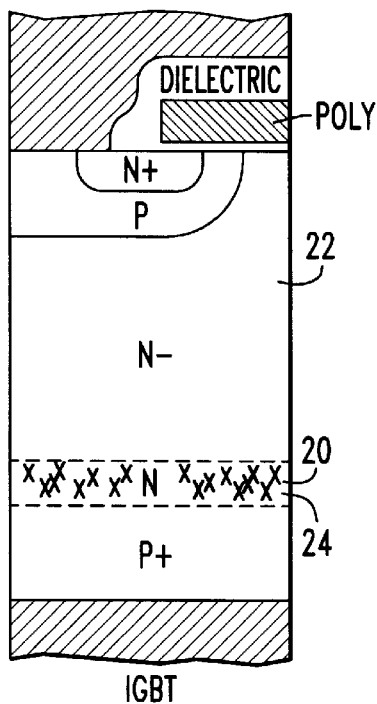
Figure 2D:
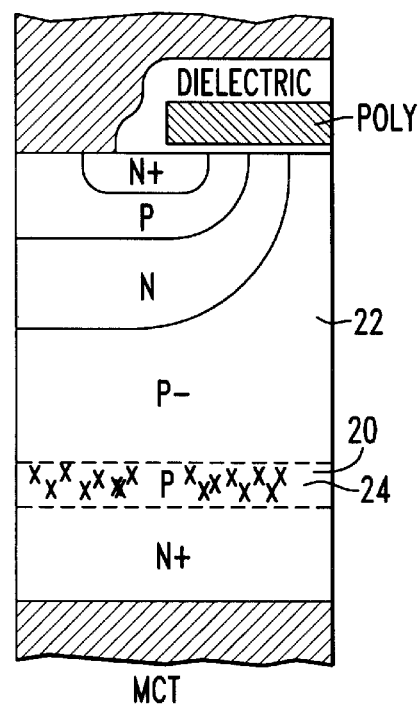
Figure 3:
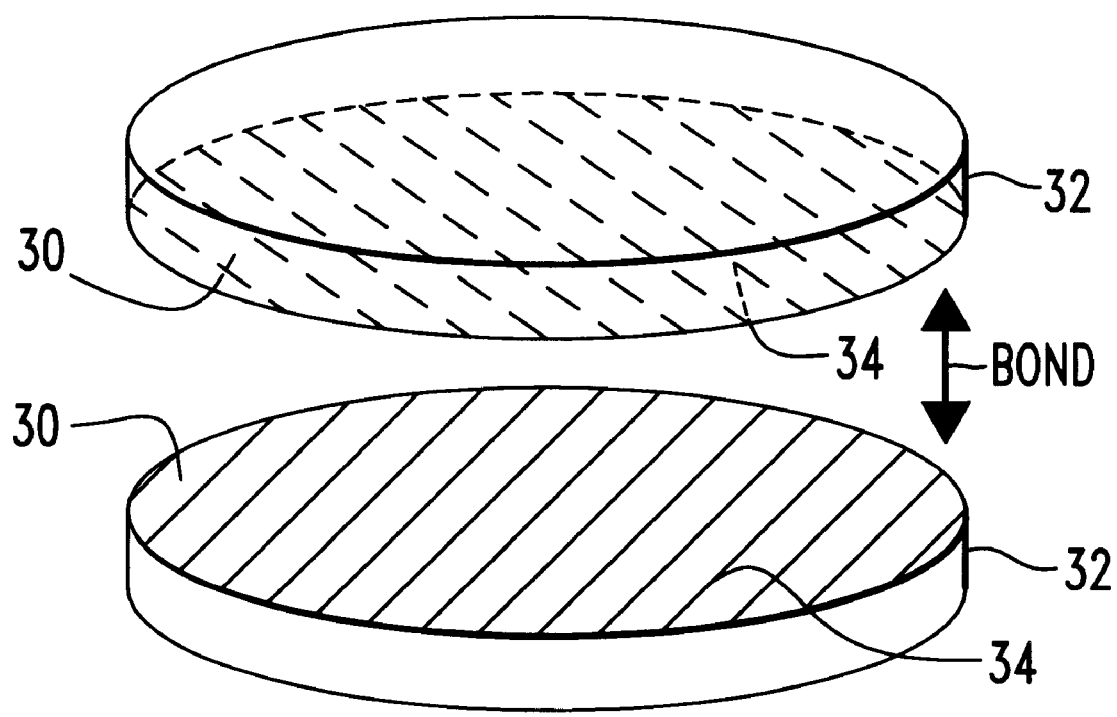
FIG. 3 is a pictorial depiction of two wafers to be bonded illustrating misalignment of crystalline features of the two wafers in an embodiment of the present invention.

With reference now to FIG. 3, one way to process the bonding surfaces is to purposely misalign corresponding features at the bonding surfaces 30 so that when the two wafers 32 are bonded the features are misaligned thereby creating dislocations at the wafer-to-wafer bonding interface. For example, one of the wafers may be rotated relative to the other so that crystalline axes of the two wafers are not aligned. In FIG. 3 these axes are highly exaggerated by the misaligned lines 34 on the facing bonding surfaces 30. By way of further example, one of the bonding surfaces 30 may be polished off-axis relative to the other bonding surface. Lines 34 in FIG. 3 are also illustrative of the polishing striations resulting from off-axis polishing. The features of either of these methods (that is, the crystal axes and the polishing striations) generate dislocations when wafers 32 are bonded. The dislocations are at the wafer-to-wafer bonding interface on both bonding surfaces 30 so that buffer layer 24 is formed with the bonding interface therein.

The amount by which wafers 32 are misaligned determines the dislocation density in buffer layer 24. Desirably, the misalignment between wafers 32 illustrated in FIG. 3 is in a range of from one to 45 degrees of the lines 34 of one wafer 32 relative to the other. The greater the misalignment, the higher the density of recombination centers. If desired, the density and distribution of these recombination centers may be modified by appropriate heat treatments, such as a furnace operation or rapid thermal annealing, after bonding.

Another method of controlling the density of recombination centers is to dope one or both of the bonding surfaces with a suitable dopant or dopants. While the dopant chosen typically depends upon the particular application, examples of suitable dopants are, for example, Au, Pt, Pd, Ag, Cu, Fe, Ni, Co. For example, dopants may be evaporated onto or implanted into one or both of the bonding surfaces after polishing and before bonding the two wafers. By way of further example, the lower bonding surface (the one on the wafer which does not have blocking layer 22 therein) may be doped with a suitable metal dopant prior to polishing and bonding, and using conventional high temperature treatments to distribute the dopants in what will become buffer layer 24 and establish the desired concentration. Desirably, the dopant concentration in the buffer layer 24 is in a range from $10^{14}/cm^3$ to $10^{19}/cm^3$, depending on the speed required. These doping methods may be used with the wafers aligned, or with the wafers purposely misaligned by a controlled amount to provide a combination of sources of recombination centers.

One of the advantages of the dopant method of the present invention is that the dopant may be selected to provide optimum switching performance (if this is desired) without regard for its solubility or diffusion coefficient. In prior art lifetime control doping (albeit not at the bonding interface which is unique to the present invention) the dopant was typically a heavy metal evaporated on to one surface of the wafer which was then heated to 800° to 900° C. at which the solid solubility of the metal produced an appropriate concentration of recombination centers. The metal had to have an appropriately high diffusion rate so that it could diffuse into the wafer in an acceptable time at this temperature. Gold and platinum were typically used because they provided the appropriate combination of energy level, solid solubility and diffusion coefficient to allow the prior art processes to work. Other metals did not meet the needed combination of characteristics. In contrast, in the present invention when the dopant is applied just prior to bonding, almost any dopant can be used and may be chosen based on energy level alone.

In the present invention the dopants do not move far from the wafer-to-wafer bonding interface because the subsequent bonding temperatures are low enough to not cause any appreciable diffusion. Of course, if some controlled amount of diffusion of the dopants is desired, suitable heat treatments may be used.

References to bonding herein are intended to refer generally to any conventional bonding technique, and particularly to the above-mentioned wafer bonding method in which the bonding surfaces of two silicon wafers are polished sufficiently flat so that when the polished surfaces are brought into contact with each other, enough of the neighboring silicon atoms can form covalent bonds across the wafer-to-wafer bonding interface to link the two wafers into a single crystal.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof. For example, the conductivity types in the figures may be reversed without departing from the spirit of the invention.

What is claimed is:

1. A method of controlling minority carrier lifetime in a semiconductor device, comprising the step of: controlling a density of recombination centers at a wafer-to-wafer bonding interface adjacent a blocking layer of the semiconductor device so that the recombination centers are concentrated in a buffer layer adjacent the blocking layer.

2. The method of claim 1, further comprising the step of: bonding two wafers at the wafer-to-wafer bonding interface so that features of bonding surfaces of the two wafers at the bonding interface are not aligned, whereby, when bonded, the misaligned features of the two wafers generate dislocations at the bonding interface which form the recombination centers.

3. The method of claim 2, further comprising the step of: setting a desired density of the recombination centers by selection of a degree of misalignment of the bonding surface features of the two wafers.

4. The method of claim 2, further comprising the step of: polishing the bonding surface of one of the two wafers at a different angle than the features of the bonding surface of the other of the two wafers.

5. The method of claim 2, further comprising the step of: rotating one of the two wafers relative to the other of the two wafers to misalign their bonding surface features.

6. The method of claim 1, further comprising the step of: doping a bonding surface of at least one of two wafers which are to be bonded at the wafer-to-wafer bonding interface, thereby forming the recombination centers.

7. The method of claim 6, further comprising the steps of: before the doping step, polishing the bonding surfaces of the two wafers; and after the doping step, bonding the polished bonding surfaces of the two wafers.

8. The method of claim 6, wherein the doping step comprises the step of evaporating a dopant onto the bonding surface.

9. The method of claim 6, wherein the doping step comprises the step of implanting a dopant into the bonding surface.

10. The method of claim 6, further comprising the steps of: after the doping step, polishing and bonding the bonding surfaces of the two wafers.

11. The method of claim 10, wherein the doping step comprises the steps of: doping with a metal dopant one of the two wafers which does not contain the blocking layer, and heating to distribute the metal dopant.

12. The method of claim 6, further comprising the step of: bonding the two wafers so that features of the bonding surfaces of the two wafers are not aligned, whereby, when bonded, the misalignment of the two wafers generates dislocations at the bonding interface which form further recombination centers.

13. The method of claim 6, further comprising the step of: bonding the two wafers so that features of the bonding surfaces of the two wafers are aligned, thereby avoiding formation of further recombination centers caused by misalignment of the two wafers.

14. The method of claim 6, further comprising the step of: selecting a dopant for the doping step based on an energy level of the dopant, not on its solubility or diffusion coefficient.

15. The method of claim 6, wherein a dopant for the doping step is one of Au, Pt, Pd, Ag, Cu, Fe, Ni, and Co.

16. The method of claim 6, wherein the concentration of a dopant in the buffer layer is in a range of from $10^{14}/cm^3$ to $10^9/cm^3$.

17. The method of claim 1, wherein the density of the recombination centers concentrated in the buffer layer is in a range of from $10^{14}/cm^3$ to $10^{19}/cm^3$.

18. The method of claim 1, wherein the thickness of the buffer layer is in a range of from 1 micron to 50 microns.

19. The method of claim 18, wherein the density of the recombination centers concentrated in the buffer layer is in a range of from $10^{14}/cm^3$ to $10^{19}/cm^3$.

20. The method of claim 1, further comprising the step of: treating the semiconductor device with heat to distribute the recombination centers in the buffer layer.

21. A method of controlling minority carrier lifetime in a semiconductor device, comprising the steps of:
   (a) providing two wafers which are to be bonded at bonding surfaces thereof to form a portion of the semiconductor device;
   (b) selectively misaligning features of the bonding surfaces of the two wafers to control a density of recombination centers in a layer adjacent a wafer-to-wafer bonding interface between the two wafers; and
   (c) bonding the bonding surfaces of the two wafers so that the features of the bonding surfaces of the two wafers are misaligned to generate dislocations which form the recombination centers in the layer.

22. The method of claim 21, further comprising the step of: doping the bonding surface of at least one of two wafers, thereby generating dislocations at the bonding interface which form further recombination centers.

23. The method of claim 21, wherein the step of selectively misaligning features of the bonding surfaces of the two wafers provides a degree of misalignment of the features of one of the two wafers relative to the other in a range of from one to 45 degrees.

24. A method of controlling minority carrier lifetime in a semiconductor device, comprising the steps of:
   (a) providing two wafers which are to be bonded at bonding surfaces thereof to form a portion of the semiconductor device;
   (b) selectively doping at least one of the bonding surfaces of the two wafers to control a density of recombination centers in a layer adjacent a wafer-to-wafer bonding interface between the two wafers, the doping forming the recombination centers in the layer; and
   (c) bonding the bonding surfaces of the two wafers.

25. The method of claim 24, further comprising the step of: before the doping step, polishing the bonding surfaces of the two wafers.

26. The method of claim 24, further comprising the step of: selecting a dopant for the doping step based on an energy level of the dopant, not its solubility or diffusion coefficient.

* * * * *